(12) United States Patent
Patzak et al.

(10) Patent No.: US 7,557,574 B2
(45) Date of Patent: Jul. 7, 2009

(54) IMAGING METHOD BASED ON FRACTAL SURFACE-FILLING OR SPACE-FILLING CURVES

(75) Inventors: Richard Patzak, Aachen (DE); Daniel Gembris, Mannheim (DE); Stephan Appelt, Julich (DE); Friedrich-Wolfgang Hasing, Julich (DE); Horst Halling, Pier (DE)

(73) Assignee: Forschungszentrum Julich GmbH, Julich (DE)

( * ) Notice: Subject to any disclaimer, the term of this patent is extended or adjusted under 35 U.S.C. 154(b) by 410 days.

(21) Appl. No.: 10/586,083

(22) PCT Filed: Dec. 17, 2004

(86) PCT No.: PCT/EP2004/053572
§ 371 (c)(1), (2), (4) Date: Jul. 13, 2006

(87) PCT Pub. No.: WO2005/073748
PCT Pub. Date: Aug. 11, 2005

(65) Prior Publication Data
US 2008/0231268 A1 Sep. 25, 2008

(30) Foreign Application Priority Data
Jan. 30, 2004 (DE) .................. 10 2004 005 005

(51) Int. Cl.
*G01V 3/00* (2006.01)

(52) U.S. Cl. ...................... 324/309; 324/307
(58) Field of Classification Search ......... 324/300–322; 600/407–455
See application file for complete search history.

(56) References Cited

U.S. PATENT DOCUMENTS

| 4,115,730 | A  |   | 9/1978  | Mansfield |         |
|-----------|----|---|---------|-----------|---------|
| 6,858,436 | B2 | * | 2/2005  | Zenhausern et al. | 436/164 |
| 6,954,068 | B1 | * | 10/2005 | Takamori et al. | 324/318 |

* cited by examiner

*Primary Examiner*—Brij B Shrivastav
(74) *Attorney, Agent, or Firm*—Pearne & Gordon LLP

(57) ABSTRACT

The present invention relates to an imaging method and device for nuclear magnetic resonance. On the one hand, the method provides an image coding by means of an additional field which has, for each point of a two-dimensional grating surface within the sample, a different field strength value that occurs only once, as is the case, e.g., in fields based on fractal, surface-filling and space-filling curves. On the other hand, the read-out of the resonance behavior of a sample along a space-filling and/or surface-filling curve can be provided. In the first variant, a magnetic resonance (MR) image with a single high-frequency excitation without a time-varying gradient can be recorded, which in turn advantageously prevents the sound generation associated therewith. In the second variant, the sounds generated during read-out are advantageously shifted to another frequency range in which the human hearing is less sensitive. Furthermore, the device is relieved and the technical requirements with regard to it are reduced. In addition, it can be executed with known and existing devices.

15 Claims, 3 Drawing Sheets

IMAGING METHOD BASED ON FRACTAL SURFACE-FILLING OR SPACE-FILLING CURVES

The present invention relates to an imaging method and a device associated therewith for nuclear magnetic resonance based on fractal surface-filling or space-filling curves.

Magnetic resonance or spin resonance is based on the fact that atomic nuclei (particularly atomic nuclei in molecules) are excited by radio waves and emit radio waves themselves. The nuclear magnetic resonance effect can further be exploited, in particular with regard to imaging, with the following nuclei: $^{13}C$, $^{15}N$, $^{129}Xe$, $^{3}He$, $^{23}Na$ und $^{17}O$. The cause for that is the protons' own rotation—their spin. As an electric charge in motion, this spin generates a small nuclear atomic magnetic field that interacts with the magnetic moments of the neighboring protons. Depending on the environment, this gives rise to a characteristic magnetic moment of the entire molecule.

Hydrogen atoms lend themselves to measurements of magnetic resonance in the human body because they are by far the most prevalent. If the person to be examined is subjected to a strong magnetic field, the spins of the protons in the body align themselves with this external magnetic field. A high frequency electromagnetic field is generally applied orthogonally to the static magnetic field. At a certain frequency, the Larmor frequency, the spins are deflected, they resonate.

If this excitation pulse is switched off, the spins of the protons revert to their original direction—and lose energy in the process, which they emit as radio waves. The magnetic portion of this radiation can be measured using a receiver coil and can then be evaluated on a computer.

By switching on an additional magnetic gradient field in a manner that is defined exactly as regards time (layer selection gradient), the spins of the protons are excited in layers. The re-emitted radio waves can be located exactly using the reading and phase gradient; image dots arise that can be composed to form an image. Thus, magnetic resonance is a commonly used non-invasive method for examining the human body. For example, functional magnetic resonance imaging serves to display local brain activity.

Fast image recording can be done by means of the so-called echo planar imaging (EPI). This is a fast measuring technique in which the entire k-space (2D) can be recorded using a single excitation pulse. Gradient echoes are recorded by EPI during the read-out of the k-space lines.

EPI is by far the fastest method in MR imaging. The classic EPI sequence employs a single excitation and then collects all data using the gradient-echo technique. An MR image can thus be made in less than 100 ms. There are spin-echo and gradient-echo variants of the EPI sequence. The gradient-echo variant ($T_2^*$-sensitive) is used to measure brain activity. Functional MR imaging is based on the BOLD effect: Blood Oxygen Level Dependent Effect. The spin-echo variant ($T_2$-sensitive) uses a 180° RF pulse after the excitation pulse in order to minimize the inhomogeneities of the field.

Using an additional 180° pulse, $T_1$-weighted images can also be taken with EPI. The pure gradient-echo variant is especially suitable for imaging of the heart. In EPI, the frequency coding gradient oscillates (continually or with plateau intervals), whereby a series of gradient echoes is generated.

In contrast to the conventional MRI techniques, the phase coding gradient is switched during read-out. In this way, all echoes get a different phase coding: the raw-data matrix is filled line after line in alternating directions. With regard to the gradient echo, the echo signal is generated by switching a pair of dephasing and rephasing gradients. To this end, the frequency coding gradient is switched on with negative polarity directly after the excitation pulse. At first, it effects fanning of the spins. Then, it is switched over to positive polarity. Now, the spins are brought into phase again (rephasing) and an echo occurs.

A tilt angle of less than 90° results in a better signal-to-noise ratio than a 90° pulse when short repetition times are used. For illustration purposes, only one (the first) excitation pulse will be examined at first. For example, an excitation pulse having a tilt angle of 20° generates a just about sufficient transversal magnetization of 34% of the maximum value. The longitudinal magnetization is 94% of the maximum value. Thus, a large longitudinal magnetization is present again for the next excitation pulse. In the case of short repetition times ($T_R$ small compared to $T_1$), a stronger MR signal is therefore generated with a smaller tilt angle than with a 90° pulse.

The smaller the longitudinal magnetization is, the faster it recovers. After each deflection about the tilt angle, the remaining longitudinal magnetization is smaller than before. But in that case, the smaller it is the faster it recovers. After several excitation pulses, an equilibrium between those two opposite tendencies arises. The longitudinal magnetization, and thus, the signal, then has equal size after each pulse. This equilibrium state is also called steady state.

However, the variation of the tilt angle not only changes the signal-to-noise ratio, but also the contrast behavior of the MR image. At the so-called Ernst angle, a maximal signal results for a given repetition time $T_R$ and a time $T_1$ which is dependent on the tissue. For diagnostic purposes, however, a tilt angle is chosen that does not necessarily optimize the signal-to-noise ration, but rather the contrast. For $T_1$-weighted images, an angle that is larger than the Ernst angle generates a better $T_1$-contrast, whereas a smaller tilt angle is desirable in the case of proton density weightings.

Because the gradient-echo sequence is very fast and because it can have very short repetition times $T_R$ compared to the $T_2$-time (down to 8 ms in the fastest sequences), a remnant transversal magnetization remains of the previous excitation. There are two ways of dealing with this fact:

The transversal magnetization is destroyed or exploited.

In the so-called FLASH method (Fast Low-Angle Shot), the remaining transversal magnetization is destroyed by a spoiler gradient by means of the FLASH sequence prior to the repeated excitation pulse, i.e., the steady state of the longitudinal magnetization is brought about after a few excitation pulses. It is only this which is used for imaging.

The high level of sound generated in the above described methods, in particular in EPI, is disadvantageous. It is based on the effect of the Lorenz force on the gradient coils located in the magnetic field through which a time-varying (at frequencies around 500 Hz) current having a strength of several amperes flows. The sound intensity of the gradient switching processes grows as the strength of the magnetic field increases. They often become apparent in the form of loud tapping noises, in some devices also as a tonal sound. Consequently, and disadvantageously, a limitation of the sound exposure that is dependent on the task to be completed by the test person is required.

Certain limitations in auditory experiments arise from the fact that the noise during the image recording can partially mask the stimuli. In addition, this noise, as an additional acoustic stimulus, leads to an activation of auditory areas that is difficult to control. The effects of the noise during image recording on the auditory cortex are the subject of intensive research.

Furthermore, process-induced "ghosting" artifacts disadvantageously arise in EPI with line read-out. "Ghosting" artifacts result from the superposition of the actual image with an image that is offset in the direction of phase coding.

Furthermore, an application of Hilbert curves in the field of MRI is known from the prior art and was disclosed in:

"Detecting Discriminative Functional MRI Activation Patterns Using Space Filling Curves", D. Kontos, V. Megalooikonomou, N. Ghubade, C. Faloutsos, EMBC2003, p. 963-966. Here, MR data that were already (conventionally) recorded are merely evaluated with regard to patterns that are characteristic for a clinical picture. By means of the Hilbert curve, 3D sets of data are mapped onto 1D data structures, which are then compared with each other.

Given the disadvantages described above, it is therefore the object of the present invention to provide a method as well as a device that make it possible to perform the process more silently in comparison, that improve imaging, that put less stress, in comparison, on the device and that reduce the demands on it.

This object is solved by the generic method with the features of the claims 1 to 7 as well as by a device according to claim 13. Advantageous embodiments become apparent from the dependent claims.

The imaging method for nuclear magnetic resonance according to the invention provides that a sample is subjected to a constant magnetic field. Typically, the static magnetic field in current MR tomographs has a strength of between 0.25 and 10 T. The basic field is necessary in order to ensure at least one minimum value of the signal-to-noise ratio. If hyperpolarized nuclei are used, the basic field may be comparatively small, i.e. less than 0.25 T.

An additional field is superimposed on the constant static magnetic field. The additional field has the property that it has a different field strength value that occurs only once for every point of at least one grating surface within the sample volume in each grating plane. This may concern several grating surfaces, and they need not necessarily be planar, they may also be spherical or cylindrical surfaces. In addition, the sample is excited by a high-frequency alternating electromagnetic field. The imaging method according to the invention furthermore provides that the electromagnetic radiation emitted by the excited sample is recorded and evaluated for the purpose of image generation. By using the additional field thus given, a time-varying gradient field may be omitted. Thus, it is possible to record a magnetic resonance (MR) image with a single high-frequency excitation without a time-varying gradient, which in turn advantageously suppresses the sound generation associated therewith. The field can be held constant over several measurements, which necessitates a wideband high-frequency excitation, or it may be switched on for each measurement using a comparatively narrowband excitation. In the case of narrowband excitation, the resonance frequencies of the spins are close to each other, which is achieved, for example, by switching off the additional field. In the case of a wideband excitation, the additional field may continue to exist which is easier to realize technically. In the method according to the invention, the electromagnetic radiation emitted by the excited sample is furthermore read out and evaluated for the purpose of image generation.

According to another embodiment of the method according to the invention, the additional field is described by surface-filling or space-filling curves, wherein these curves have a biunique allocation of the field strength value and the point of the grating. Because of the biunique allocation of position and frequency, the image reconstruction can be effected by means of a 1D-Fourier transformation. Thus, a raw-data matrix is filled with data and converted into an MR image by a 1D-Fourier transformation. The measurement of several surfaces can take place sequentially, for example. The object to be examined, for example, is transported past the measuring set-up or through it, or individual segments of the measuring set-up are activated one after the other.

The additional field is described by surface-filling or space-filling curves. These are, for example, curves that are constructed by means of L-systems, as described in "Chaos and Fractals", Peitgen et al. In this manner, field jumps between adjacent points are advantageously reduced, which in turn minimizes artifacts; the reason for this is that the jumps of the field strength necessary for the optimal satisfaction of the uniqueness condition can only be effected in approximation (continuous transition of the field strength between adjacent grating points, technical effort for the field generation). There is, e.g., a violation of the uniqueness condition if two different positions are mapped onto one frequency in the spectrum. It cannot be determined anymore from which position the signal comes. Provisionally, the signal can then be divided into equal parts for both positions. This leads to a smearing of the image, in particular along those lines that lie between areas with strongly differing field strengths. The magnetic field that is defined thus is generated, for example, by a current-carrying arrangement of coils that is determined by a numerical optimization. This is a magnetostatic calculation wherein the differences from the given values of the magnetic field and the numerically determined values are to be minimized.

A further embodiment of the method according to the invention provides that several areas of the sample are measured simultaneously, i.e. parallel with regard to time. This is achieved, for example, by using a measuring set-up that, accordingly, is formed in a multiple manner. In this way, the method according to the invention can be performed particularly fast.

In a further advantageous variant of the invention, echoes are being generated. This is a fast measuring technique in which they are, for example, spin echoes and gradient echoes.

In a further embodiment, in order to generate the echo, it is provided that the additional field changes its sign over time. In analogy to the known MR imaging, gradient echoes can be generated by a change of the sign, however, not for individual k-space lines, but for an entire image at once. This allows for the execution of a fast spectroscopic MR imaging: an excitation and recording of several consecutive echo images.

In a further embodiment of the method according to the invention, the additional field is described by a Hilbert curve, a special space-filling and surface-filling curve. If the Hilbert curve is taken as a basis, the result is a hierarchic artifact structure, i.e. there is a negative correlation between size of the artifacts and the frequency of their occurrence. In this way, a compromise is advantageously achieved, because weak artifacts can be tolerated rather than strong ones.

The method according to the invention can be used for measuring current distributions or magnetic fields. Because no gradients are switched, no (undesired) currents can be induced in the sample.

A further alternative imaging method for nuclear resonance provides that a spatially detectable transversal magnetization is generated in the sample by means of high frequency excitation. By switching imaging gradients, a spatially resolved measurement of the transversal magnetization is effected. In a data acquisition phase, the read-out of the signal is done along fractal space-filling curves, and a raw-data matrix is formed from the obtained data. An image is obtained from the raw-data matrix by means of a Fourier transformation.

In known methods, the raw-data matrix (so-called k-space) is generated in lines or by sampling on circular trajectories. In the conventional EPI line sampling, the reading gradient (which is often operated almost at maximum amplitude) alternates between every k-space line, creating the noises with frequencies in the region of 500 Hz that are typical for the sequences. "Sequence" denotes the succession of high frequency excitations, gradient pulses and data acquisitions. In the method according to the invention, the sign of the gradients changes distinctly more often, almost with every k-space point, which practically corresponds to a line-up of EPI "blips". "Blip" denotes a gradient pulse that is necessary for changing from one k-space line to the next. This results in the gradient noises advantageously being shifted into a higher frequency range (at a resolution of 64×64, from frequencies of around 500 Hz to frequencies of around 32,000 Hz). The effect can be used advantageously for performing auditory brain imaging studies because they are, in part, strongly affected by gradient noises. This is in part due to the fact that the human hearing is particularly sensitive in the frequency range responsible for generating speech.

Complicated and expensive measures for reducing sound generation by means of passive or even active sound attenuation can advantageously be omitted because of the method according to the invention. According to the state of the art, sequence-oriented measures for reducing sound consist of slowing down the k-space read-out and the reduction of the k-space lines, which disadvantageously increases the measurement time or reduces the resolution.

Furthermore, the method according to the invention avoids sustained "gradient plateaus" which results in a relieving of the gradient amplifiers and/or lesser technical requirements with regard to the gradient amplifiers. A further advantage of the image coding according to the invention consists of the reduction of the periodicity of the gradient timing, thereby in turn reducing mechanical resonances of the imaging device.

According to another embodiment of the method according to the invention, the space-filling trajectory is described by a Hilbert curve. In the case of the Hilbert curve (trajectory), adjacent k-space points are sampled at similar points in time resulting in possible artifacts distributing themselves more uniformly over the k-space. There exists an analogous approach in methods for the color space reduction in position space images ("dither algorithms").

A further embodiment provides that data acquisition takes place in segments. I.e., the k-space is divided into individual segments, which are themselves sampled along a space-filling curve ("hybrid method"), that is, an excitation pulse is generated for each segment. A segmentation can be particularly advantageous when the relaxation times are short.

The aforementioned methods can advantageously be realized with known and existing devices for nuclear magnetic resonance imaging, only their pulse frequency must be adjusted, for example.

A further embodiment of the method according to the invention provides that the image coding takes place in three dimensions. Thus, it is suitable for the so-called echo-volumar imaging. This is a three-dimensional EPI wherein the layer selection is advantageously omitted.

A further embodiment provides-that parts of the measuring set-up are moved past or through a sample, or that individual gradient coils are activated successively.

The invention further relates to devices for performing the respective afore-mentioned methods with the advantages connected thereto. According to a first device, a constant static magnetic field is provided that acts on a sample. The device comprises means for generating an additional field that is superimposed on the static magnetic field and which has, in at least one grating surface within the sample volume, different field strength values at each point of the grating surface. Furthermore, means are provided for generating a high-frequency electromagnetic alternating field whereby the sample is excited. In a particularly simple variant, the means for the generation of a high-frequency electromagnetic alternating field comprise a high-frequency transmitter/receiver coil that surrounds the entire sample. The means for reading out serve the purpose of registering the electromagnetic radiation emitted by the excited sample. Furthermore, means for evaluation and image generation are provided. For example, the devices are known MR imaging devices. By using the additional field thus given, a time-varying gradient field may be omitted. Thus, it is possible to record a magnetic resonance (MR) image with a single high-frequency excitation without a time-varying gradient, which in turn advantageously prevents the sound generation associated therewith.

According to another embodiment of the device according to the invention, the means for generating an additional field comprise a micro coil arrangement. These are, for example, so-called micro coil arrays like they are used in surface measuring or in biology or biochemistry for screening systems. The filed can, for example, be generated by means of micro coils arranged matrix-like (n×m) on a rectangular area. For example, the sample lies on those coils or immediately borders on them. In order to be able to describe the additional field, for example, by a Hilbert curve, a special space-filling and surface-filling curve, the currents of the micro coils are defined by the values along this Hilbert curve with a linear increase of the field strength along the curve.

Another device according to the invention provides that means are provided for the generation of a detectable transversal magnetization in a sample. Furthermore, the device provides means for data acquisition of a signal along a fractal space-filling trajectory. Furthermore, means for data evaluation are provided that form a raw-data matrix from the acquired data and that obtain an image from the raw-data matrix by means of Fourier transformation. The device according to the invention advantageously provides for a reduction or a shift of the "sequence"-noises. The effect can be used advantageously for performing auditory brain imaging studies because they are, in part, strongly affected by gradient noises. This is in part due to the fact that the human hearing is particularly sensitive in the frequency range relevant for generating speech. Complicated and expensive measures for reducing sound generation by means of passive or even active sound attenuation can advantageously be omitted in the device according to the invention. The device can be kept comparatively simple because sustained "gradient plateaus" are avoided, which results in a relieving of the gradient amplifiers and/or lesser technical requirements with regard to the gradient amplifiers. A further advantage of the image coding according to the invention consists of a reduction of the periodicity of the gradient timing, thereby in turn reducing mechanical resonances of the imaging device.

REGARDING THE FIGURES

Figure 1:
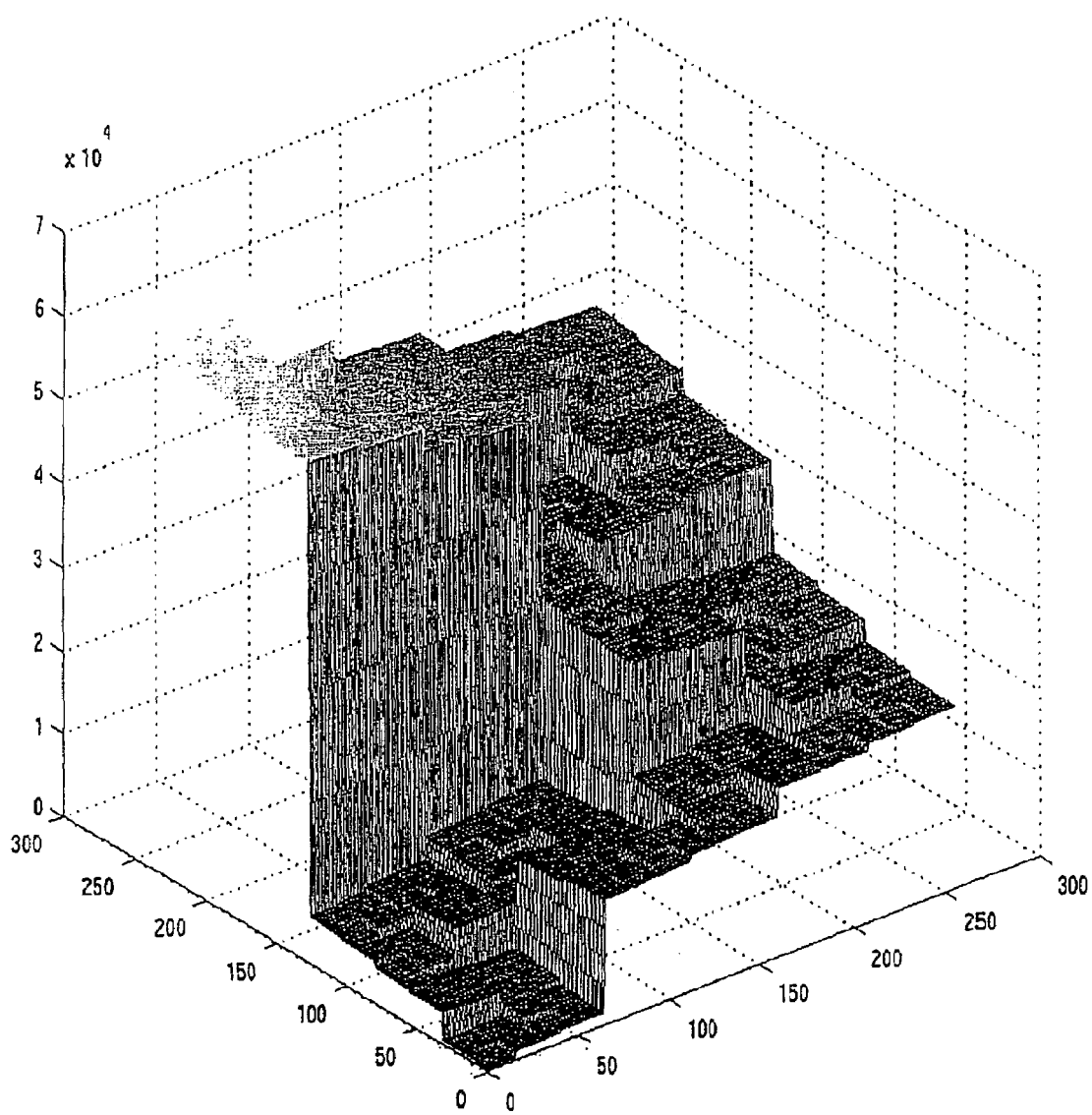
FIG. 1 is a 3D rendering of a two-dimensional Hilbert curve. The z-coordinate specifies the point in time at which the corresponding k-space point has been reached, or the strength of the additional field as a function of position.
Figure 2A:
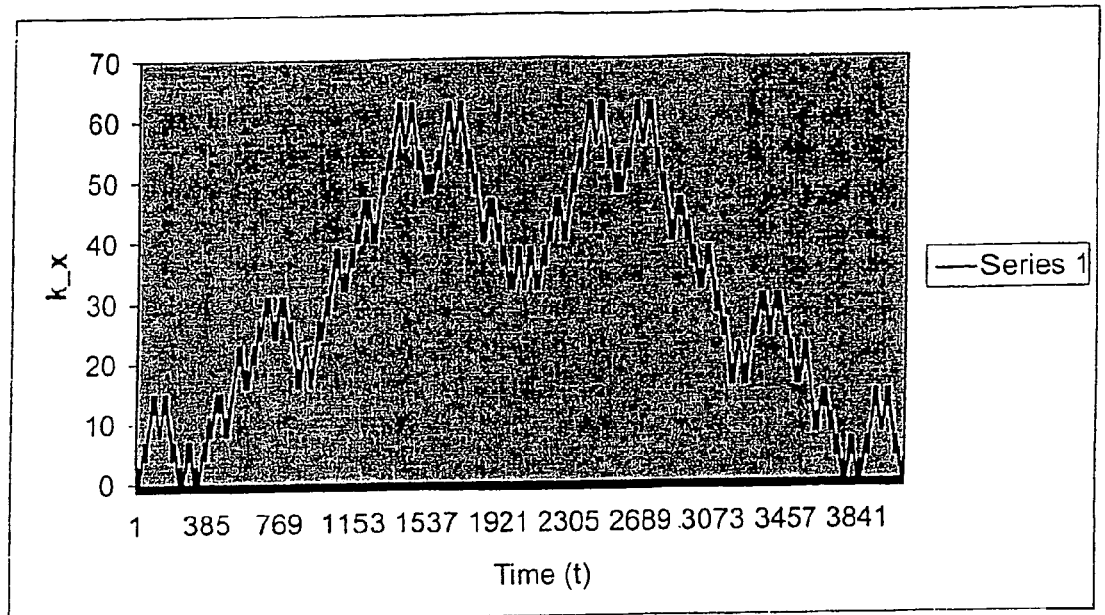
FIG. 2a shows, as an example, the $k_x$-component of a Hilbert trajectory for a resolution of 64×64 voxels.
Figure 2B:
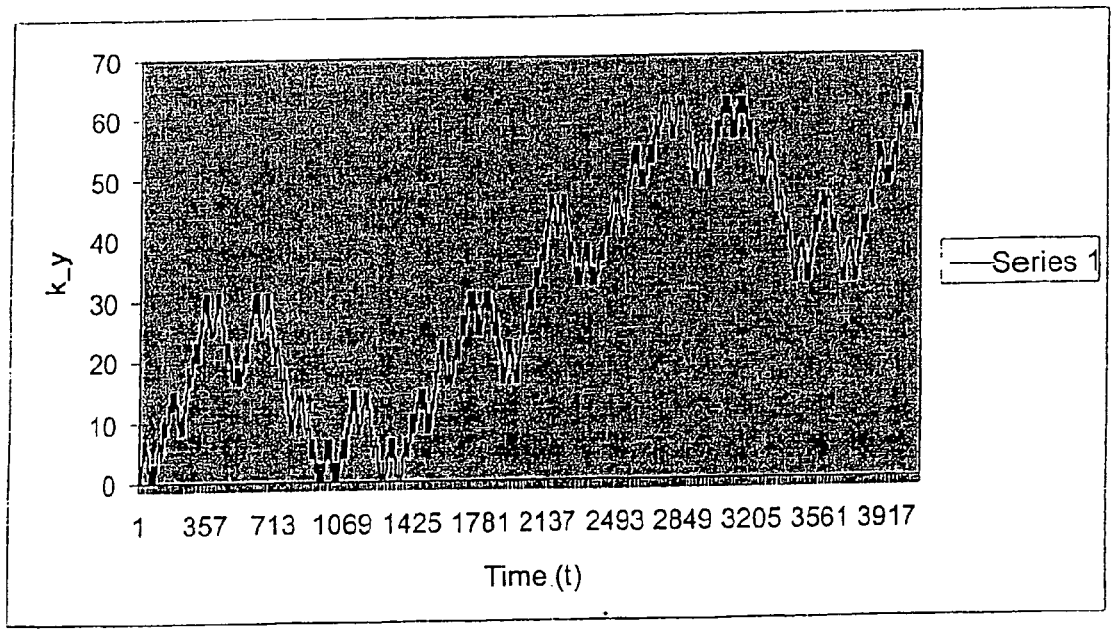
FIG. 2b shows, as an example, the $k_y$-component of a Hilbert trajectory for a resolution of 64×64 voxels.
Figure 3A:
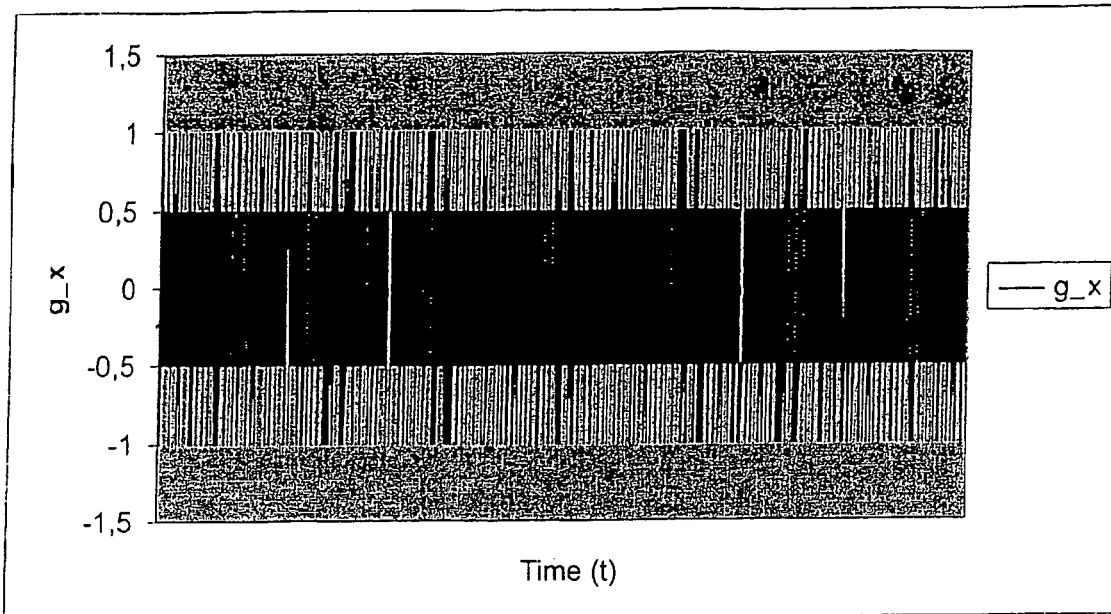
FIG. 3a shows the x-component of the gradient field for the coding of the Hilbert trajectory which results by time derivation from the k(t) course.
Figure 3B:
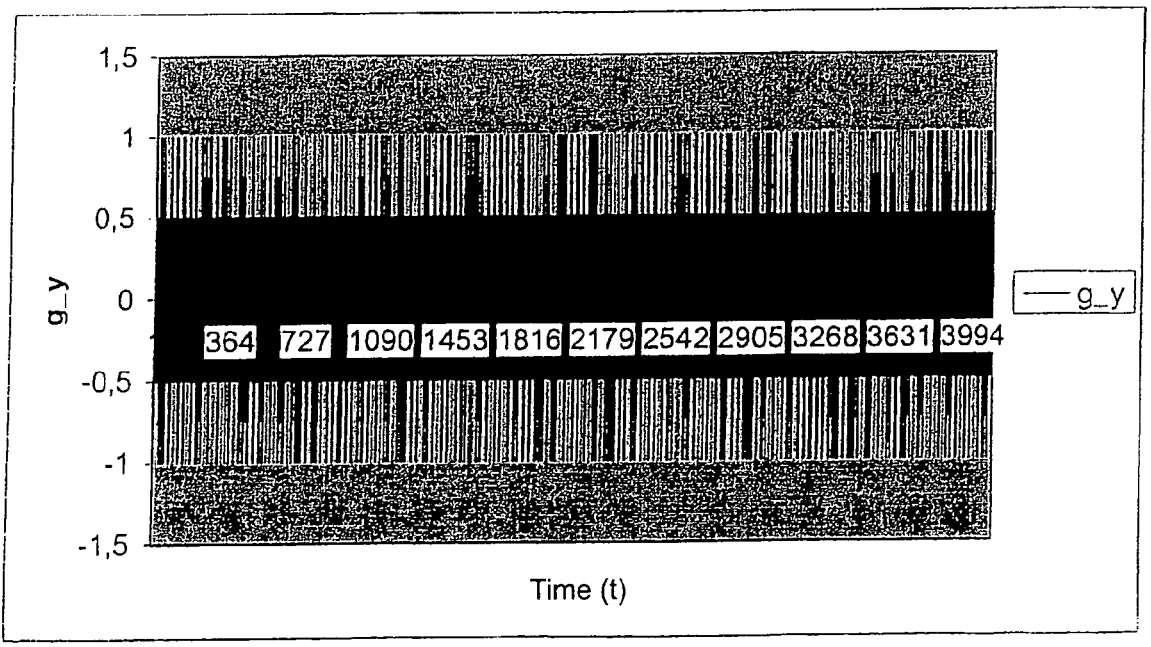
FIG. 3b shows the y-component of the gradient field for the coding of the Hilbert trajectory which results by time derivation from the k(t) course.

The invention claimed is:

1. Imaging method for nuclear magnetic resonance, comprising applying a constant static magnetic field upon a sample, applying an additional magnetic field superimposed on the static magnetic field, the additional field having, in at least one grating surface within the sample volume, different field strength values at each point of the grating surface, exciting the sample with a high-frequency electromagnetic alternating field, and reading and evaluating electromagnetic radiation emitted from the excited sample to generate images, and wherein the additional field is described by surface-filling or space-filling curves, there being a biunique correlation between field strength values and point of the grating for these curves.

2. Imaging method for nuclear magnetic resonance according to claim 1, wherein a one-dimensional Fourier transformation is used.

3. Imaging method for nuclear magnetic resonance according to claim 1, wherein several areas of the sample are measured at the same time.

4. Imaging method for nuclear magnetic resonance according to claim 1, wherein echoes are generated.

5. Imaging method for nuclear magnetic resonance according to claim 4, wherein the additional field changes its sign over time for generating the echo.

6. Imaging method for nuclear magnetic resonance according to claim 1, wherein the additional field is described by a Hilbert curve.

7. Imaging method for nuclear magnetic resonance, comprising generating a spatially detectable transversal magnetization signal in a sample, reading the signal along a fractal space-filling trajectory during a data acquisition phase, forming a raw-data matrix and determining an image from the raw-data matrix by means of Fourier transformation.

8. Imaging method for nuclear magnetic resonance according to claim 7, wherein the fractal space-filling trajectory is described by a Hilbert curve.

9. Imaging method for nuclear magnetic resonance according to claim 7, wherein the data acquisition takes place in segments.

10. Imaging method for nuclear magnetic resonance according to claim 7, wherein an image coding takes place in three dimensions.

11. Imaging method for nuclear magnetic resonance according to claim 7, wherein parts of a measuring set-up are moved past the sample or through the sample or segments of the magnetic field(s) are activated successively.

12. Device for executing the method according to claim 1, comprising a constant static magnetic field acting on a sample, means for generating an additional field that is superimposed upon the static magnetic field and that has, in at least one grating surface within the sample volume, different field strength values at each point of the grating surface, means for generating a high-frequency electromagnetic alternating field whereby the sample is excited, means for reading out the electromagnetic radiation emitted by the excited sample, and means for evaluation and image generation, means for generating a spatially detectable transversal magnetization in a sample, means for data acquisition of a signal along a fractal space-filling trajectory, means for data evaluation forming a raw-data matrix from the acquired data and obtaining an image from the raw-data matrix by means of Fourier transformation.

13. Device according to claim 12, wherein the means for generating an additional field comprise a micro coil arrangement.

14. Device for executing the method according to claim 7, comprising means for generating a spatially detectable transversal magnetization in a sample, means for data acquisition of a signal along a fractal space-filling trajectory, means for data evaluation forming a raw-data matrix from the acquired data and obtaining an image from the raw-data matrix by means of Fourier transformation.

15. Imaging method for nuclear magnetic resonance, comprising applying a constant static magnetic field upon a sample, applying an additional magnetic field superimposed on the static magnetic field, the additional field having, in at least one grating surface within the sample volume, different field strength values at each point of the grating surface, the additional field being described by a Hilbert curve, exciting the sample with a high-frequency electromagnetic alternating field, and reading and evaluating electromagnetic radiation emitted from the excited sample to generate images.

* * * * *